(12) United States Patent
Yim et al.

(10) Patent No.: US 10,032,890 B2
(45) Date of Patent: Jul. 24, 2018

(54) METHOD OF MANUFACTURING SEMICONDUCTOR DEVICES

(71) Applicant: SAMSUNG ELECTRONICS CO., LTD., Suwon-si, Gyeonggi-do (KR)

(72) Inventors: Jun-Hwan Yim, Seoul (KR); Yeon-Tack Ryu, Yongin-si (KR); Joo-Cheol Han, Hwaseong-si (KR); Ja-Eung Koo, Yongin-si (KR); No-Ul Kim, Seoul (KR); Ho-Young Kim, Seongnam-si (KR); Bo-Un Yoon, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 15/361,516

(22) Filed: Nov. 28, 2016

(65) Prior Publication Data
US 2017/0162675 A1 Jun. 8, 2017

(30) Foreign Application Priority Data
Dec. 8, 2015 (KR) .................. 10-2015-0173709

(51) Int. Cl.
H01L 21/336 (2006.01)
H01L 29/66 (2006.01)
H01L 21/02 (2006.01)
H01L 21/28 (2006.01)
H01L 21/3105 (2006.01)
H01L 21/8238 (2006.01)
(Continued)

(52) U.S. Cl.
CPC .... *H01L 29/66795* (2013.01); *H01L 21/0217* (2013.01); *H01L 21/0228* (2013.01); *H01L 21/28088* (2013.01); *H01L 21/31051* (2013.01); *H01L 21/31058* (2013.01); *H01L 21/823821* (2013.01); *H01L 21/823828* (2013.01); *H01L 29/4966* (2013.01); *H01L 29/517* (2013.01); *H01L 29/66545* (2013.01)

(58) Field of Classification Search
CPC .......... H01L 29/66795; H01L 21/0217; H01L 21/0228
See application file for complete search history.

(56) References Cited

U.S. PATENT DOCUMENTS 8,138,038 B2 3/2012 Heinrich et al.
8,507,979 B1 8/2013 Huang et al.
(Continued)

FOREIGN PATENT DOCUMENTS

KR 10-2015-0010570 A 1/2015

*Primary Examiner* — Bradley K Smith
(74) *Attorney, Agent, or Firm* — Lee & Morse, P.C.

(57) ABSTRACT

Disclosed is a method of manufacturing semiconductor devices. A gate trench and an insulation pattern defined by the gate trench are formed on a substrate and the protection pattern is formed on the insulation pattern. A gate dielectric layer, a work function metal layer and a sacrificial layer are sequentially formed the substrate along a surface profile of the gate trench. A sacrificial pattern is formed by a CMP while not exposing the insulation pattern. A residual sacrificial pattern is formed at a lower portion of the gate trench and the gate dielectric layer and the work function metal layer is etched into a gate dielectric pattern and a work function metal pattern using the residual sacrificial pattern as an etch stop layer.

20 Claims, 14 Drawing Sheets

(51) Int. Cl.
  *H01L 29/49*  (2006.01)
  *H01L 29/51*  (2006.01)

(56) References Cited

U.S. PATENT DOCUMENTS

| | | |
|---|---|---|
| 9,012,319 B1 | 4/2015 | Choi et al. |
| 9,136,175 B2 | 9/2015 | Wei et al. |
| 9,147,680 B2 | 9/2015 | Trevino et al. |
| 2015/0021513 A1 | 1/2015 | Kim et al. |
| 2015/0041905 A1 | 2/2015 | Xie et al. |
| 2015/0108577 A1 | 4/2015 | Cai et al. |
| 2015/0145057 A1* | 5/2015 | Fan ................. H01L 27/092 257/369 |
| 2015/0145062 A1* | 5/2015 | Chudzik ........ H01L 21/823807 257/392 |
| 2015/0171086 A1 | 6/2015 | Cai et al. |
| 2015/0221743 A1 | 8/2015 | Ho et al. |
| 2015/0228748 A1 | 8/2015 | Alptekin et al. |
| 2015/0279837 A1 | 10/2015 | Lee et al. |
| 2016/0104788 A1* | 4/2016 | Ryu ................. H01L 29/66545 438/586 |

\* cited by examiner

METHOD OF MANUFACTURING SEMICONDUCTOR DEVICES

CROSS-REFERENCE TO RELATED APPLICATION

Korean Patent Application No. 10-2015-0173709, filed on Dec. 8, 2015, in the Korean Intellectual Property Office, and entitled: "Method of Manufacturing Semiconductor Devices," is incorporated by reference herein in its entirety.

BACKGROUND

1. Field

Example embodiments relate to a method of manufacturing semiconductor devices, for example, to a method of manufacturing finFET devices.

2. Description of the Related Art

As recent semiconductor devices have been highly integrated and downsized, the height distribution of gate electrodes of the semiconductor device has been rising as a major interest.

SUMMARY

Embodiments are directed to a method of manufacturing a semiconductor device, the method including forming an insulation pattern on a substrate such that the insulation pattern is covered by a protection pattern and has a gate trench through which an active region of the substrate is partially exposed, sequentially forming a gate dielectric layer and a work function metal layer on the substrate along a surface profile of the gate trench such that the protection pattern is covered by the gate dielectric layer, forming a sacrificial layer on the work function metal layer to fill the gate trench, planarizing the sacrificial layer without exposing the insulation pattern to thereby form a sacrificial pattern in the gate trench, forming a residual sacrificial pattern in the gate trench by removing an upper portion of the sacrificial pattern, and partially removing the work function metal layer and the gate dielectric layer to form a gate dielectric pattern and a work function metal pattern such that upper surfaces of the gate dielectric pattern and the work function metal pattern are coplanar with an upper surface of the residual sacrificial pattern.

Embodiments are also directed to a method of manufacturing a semiconductor device, the method including forming a preliminary gate structure on a substrate, the preliminary gate structure having a dummy gate line extending in a second direction and partially covering an active fin, which is protruded from the substrate into a line extending in a first direction, and forming source/drain junctions arranged at surface portions of the active fin and separated from the dummy gate line by a gate spacer, forming an insulation interlayer pattern covering the source/drain junctions and exposing the dummy gate line and the gate spacer, forming a protection pattern on the insulation interlayer pattern, removing the dummy gate line from the substrate, thereby forming a gate trench through which the active fin is partially exposed, sequentially forming a gate dielectric layer and a work function metal layer on the substrate along a surface profile of the gate trench such that the protection pattern is covered by the gate dielectric layer, forming a sacrificial layer on the work function metal layer to a thickness to fill the gate trench, planarizing the sacrificial layer without exposing the insulation interlayer pattern and the gate spacer, thereby forming a sacrificial pattern in the gate trench, forming a gate dielectric pattern and a work function metal pattern in the gate trench by node-separating the gate dielectric layer and the work function metal layer by the gate trench, and forming a gate conductive pattern in the gate trench after a removal of the sacrificial pattern, thereby forming a gate structure having the gate dielectric pattern, the work function metal pattern, and the gate conductive pattern.

Embodiments are also directed to a method of manufacturing a semiconductor device, the method including forming an insulation pattern on a substrate, the insulation pattern having first and second gate trenches therein, the first and second gate trenches exposing an active region of the substrate at the bottom of the trenches, the first trenches being in a first region, the second trenches being in a second region, the first region having a lower gate trench pattern density than the second region, sequentially forming a gate dielectric layer and a work function metal layer on respective sidewalls and bottoms of the first and second gate trenches, forming a sacrificial layer using a sacrificial material that completely fills the first and second gate trenches in the first and second regions, the sacrificial layer extending along the top surface of the insulation pattern between the adjacent trenches, planarizing the sacrificial layer without exposing the insulation pattern, partially removing the sacrificial material to expose portions of the work function metal layer and to form a residual sacrificial pattern in the gate trenches, and etching portions of the work function metal layer and the gate dielectric layer to form respective gate dielectric patterns and work function metal patterns in the first and second trenches, the residual sacrificial pattern serving as an etch stop in the etching of the gate dielectric pattern and the work function metal pattern.

BRIEF DESCRIPTION OF THE DRAWINGS

Features will become apparent to those of skill in the art by describing in detail example embodiments with reference to the attached drawings in which.

DETAILED DESCRIPTION

Figure 1A:
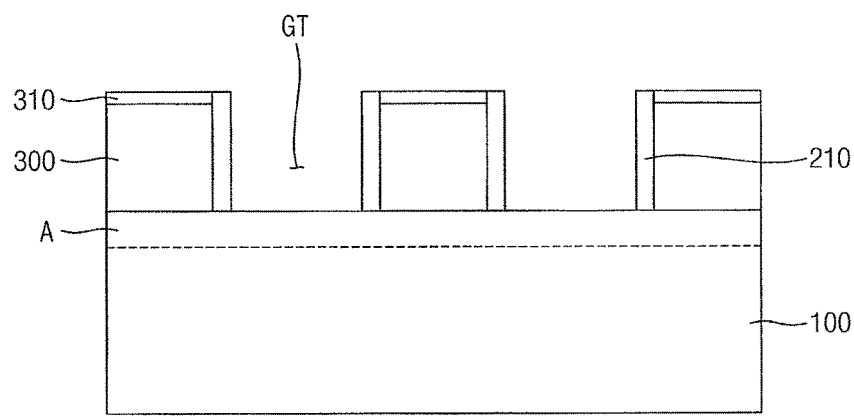
FIGS. 1A to 1H illustrate cross-sectional views of stages in a method of manufacturing semiconductor devices in accordance with an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. Like reference numerals refer to like elements throughout.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required and that latitude for the shape is within the scope of the disclosure. Although the tubular elements of the embodiments may be cylindrical, other tubular cross-sectional forms are contemplated, such as square, rectangular, oval, and triangular and others.

Although corresponding plan views and/or perspective views of some cross-sectional view(s) may not be shown, the cross-sectional view(s) of device structures illustrated herein provides support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIGS. 1A to 1H are cross-sectional views of stages in a method of manufacturing semiconductor devices in accordance with an example embodiment.

Referring to FIG. 1A, an insulation pattern 300 may be formed on a substrate 100 in such a way that the insulation pattern 300 may be covered by a protection pattern 310 and may have a gate trench GT through which an active region A of the substrate 100 may be partially exposed.

For example, the substrate 100 may include a semiconductor substrate such as a silicon (Si) substrate, a gallium (Ga)-arsenic (As) substrate, and a silicon (Si)-germanium (Ge) substrate, and a glass substrate for a flat display panel. In addition, the substrate 100 may include a silicon-on-insulator (SOI) substrate in which a pair of silicon layers may be separated by an insulation layer. The substrate 100 may include any other substrates as long as the substrate may include semiconductor characteristics.

The substrate 100 may include the active region A that may be defined by a field region (not illustrated) and various conductive structures such as transistors may be formed on the active region A in subsequent processes. The active region A may be shaped into a line extending in a first direction x or may be shaped into discrete islands along a slant line with respect to the first direction x. For example, the active region A may be shaped into a fin shaped line that may be protruded from a surface of the substrate 100. Thus, the active region A will be referred to as an active fin in view of the fin shape or an active line in view of the line shape sometimes.

Neighboring active regions A may be isolated from each other by a device isolation layer (not shown) in the field region, and thus the transistors on the neighboring active regions may also be isolated from each other by the device isolation layer. For example, the device isolation layer may include silicon oxide that may be formed by a local oxidation of silicon (LOCOS) process or a shallow-trench isolation (STI) process.

The gate trench GT may extend in a second direction y substantially perpendicular to the first direction x, so that gate trench GT may cross the line-shaped active region A. Thus, the active region A may be partially exposed through the gate trench GT. In the present example embodiment, the first direction x denotes the direction along which the active line extends, and the second direction y denotes the direction along which a gate line extends, perpendicular to the active line. A gate spacer 210 may be formed on a sidewall of the gate trench GT and thus the space of the gate trench GT may be defined by the gate spacer 210.

A dummy gate line (not shown) may be formed on the substrate 100 in such a way that the dummy gate line may extend in the second direction y and may be spaced apart by a gap space in the first direction x. The gate spacer 210 may be formed on the sidewalls of the dummy gate line, so the gap space between the dummy gate lines may be defined by the gate spacer 210. Then, insulation materials may be filled up in the gap space between the gap spacers 210, thereby forming the insulation pattern 300. Thereafter, the dummy gate line may be removed from the substrate 100, thereby forming the gate trench GT defined by the gate spacer 210.

In the present example embodiment, the insulation pattern 300 may include a line-shaped insulation interlayer pattern extending in the second direction y, and an upper surface of the insulation pattern 300 may be covered by the protection pattern 310. Thus, the insulation pattern 300 may be protected from a subsequent process and thus the height of the insulation pattern 300 may be maintained in the subsequent process.

When forming a gate electrode through a gate-last process, the height of the insulation pattern 300 may determine the height of the gate electrode having the work function metal layer, and the threshold voltages of multilevel semiconductor devices may be varied by the height of the work function metal layer. Thus, according to the present example embodiment, the height of the insulation pattern 300 is maintained so as to maintain the height of the work function metal layer.

The insulation pattern 300 may be protected from the subsequent processes by the protection pattern 310, and thus the height of the insulation pattern 300 may be maintained in the subsequent processes. Therefore, the height of the gate electrode and the work function metal layer may be maintained in the subsequent processes.

For example, an insulation layer such as silicon oxide (SiO) layer may be formed on the substrate 100 by a chemical mechanical deposition (CVD) process to a sufficient thickness to cover the gate spacer 210 and the dummy gate line, and then may be planarized in such a way that the insulation layer may remain just in the gap space between the gate spacer 210. Then, silicon nitride (SiN) pattern may be formed on the insulation pattern 300 by an atomic deposition layer (ALD) process as the protection pattern 310 in such way that an upper surface of the protection pattern 310 may be coplanar with an upper surface of the dummy gate line.

Although not shown in figures, source/drain junctions (not shown) may be formed on the active region A around the gate spacer 210 before forming the insulation pattern 300. For example, p-type dopants or n-type dopants may be implanted onto the active region A by an ion implantation process to thereby form the source/drain junctions at surface portions of the active region A of the substrate 100. In another implementation, an epitaxial layer may be formed on the active region A by a selective epitaxial growth (SEG) by using the semiconductor materials of the active region A as seed materials.

Figure 1B:
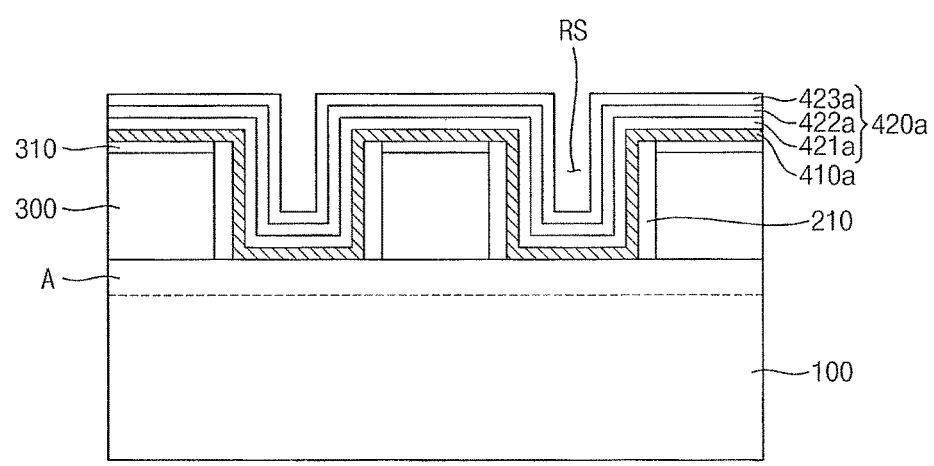

Referring to FIG. 1B, a gate dielectric layer 410a and a work function metal layer 420a may be sequentially formed on the substrate 100 along a surface profile of the gate trench GT in such a way that the protection layer 310 and the gate spacer 210 may be covered by the gate dielectric layer 410a.

For example, the gate dielectric layer 410a may be formed on the substrate 100 along the surface profile of the gate trench GT.

The gate dielectric layer 410a may include a high-k material such as hafnium oxide (HfO) or zirconium oxide (ZrO), the dielectric constant of which may be greater than that of silicon oxide ($SiO_2$). In a modified example embodiment, a gate insulation layer (not shown) including silicon oxide ($SiO_2$) may be further formed between the active region A and the gate dielectric layer 410a.

Then, the work function metal layer 420a may be formed on the gate dielectric layer 410 along the surface profile of the gate trench GT. The work function metal layer 420a may have various work functions according to a corresponding transistor of the semiconductor devices, so that the semiconductor device may have multilevel threshold voltages Vth.

In an example embodiment, the semiconductor device may include a complementary metal oxide semiconductor (CMOS) device having a first group of p-type MOS (PMOS) and n-type MOS (NMOS) transistors, of which the threshold voltage may be relatively lower, and a second group of PMOS and NMOS transistors, of which the threshold voltage may be relatively higher. In another example embodiment, the semiconductor device may include another CMOS device having a first group of PMOS and NMOS transistors, of which the threshold voltage may be lowest, a second group of PMOS and NMOS transistors, of which the threshold voltage may be relatively lower, and a third group of PMOS and NMOS transistors, of which the threshold voltage may be relatively higher. The same group of the transistors may have the same threshold voltages and the threshold voltages of each group of the transistors may be varied according to the characteristics and compositions of the work function metal layer 420a.

Thus, the work function metal layer 420a may be formed into a multilayer structure in such a way that the compositions of each component layer and the characteristics such as a layer thickness of each component layer may be controlled in view of the work function for the corresponding threshold voltages of each group.

Thus, the work function metal layer 420a in the gate trench GT may have different characteristics in relation to the threshold voltage of the transistor at the gate trench GT, and the residual space RS in the gate trench GT may be varied by the characteristics such as each component layer thickness of the work function metal layer 420a. Accordingly, the size of the residual space RS in the gate trench GT may be varied according to the cell characteristics at the gate trench GT.

In the present example embodiment, the work function metal layer 420a may include first to third metal layers 421a to 423a that may be sequentially stacked on the gate dielectric layer 410a, for example, by a CVD process or an ALD process. For example, the first and the second metal layers 421a and 422a may include one of titanium nitride (TiN), tantalum nitride (TaN), cobalt (Co), titanium aluminum (TiAl) and lanthanum oxide (LaO), and the third metal layer 423a may include one of titanium nitride (TiN) and tantalum nitride (TaN). In the present example embodiment, the first to third metal layers 421a to 423a may include titanium nitride (TiN), tantalum nitride (TaN) and titanium nitride (TiN), respectively.

Figure 1C:
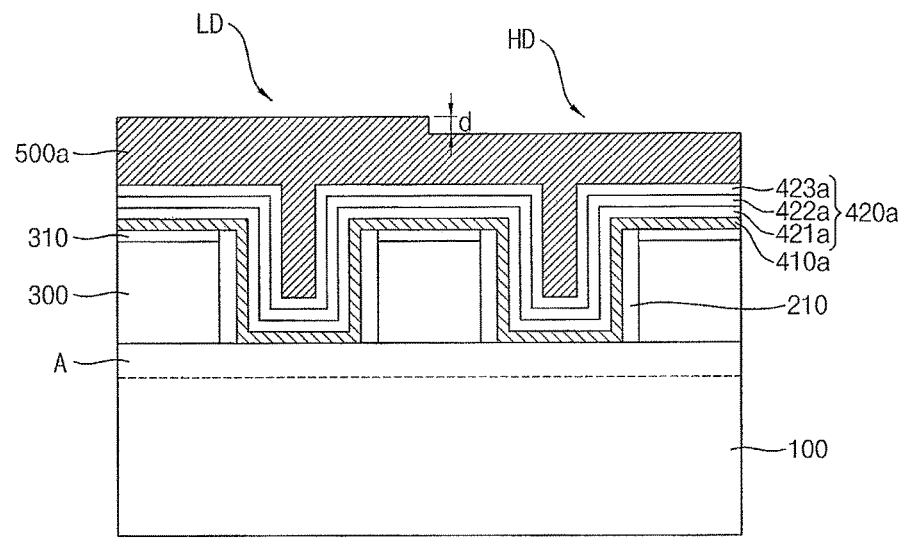

Referring to FIG. 1C, a sacrificial layer 500a may be formed on the work function layer 420a to a sufficient thickness to fill up the gate trench GT. The sacrificial layer 500a may function as a reference layer in a subsequent etching process for individually controlling the height of the work function metal layer 420a according to each group of the transistors.

For example, the sacrificial layer 500a may include organic materials without silicon (Si) that may be coated on the work function metal layer 420a by a spin coating process. In the present example embodiment, the sacrificial layer 500a may include one of a spin-on carbon (SOC) layer and a spin-on hard mask (SOH) layer.

In the multilevel devices having multilevel threshold voltages, relatively more cell transistors may be arranged in a first area (high density area, HD) and relatively less cell transistors may be arranged in a second area (low density area, LD) of the substrate 100, and the size of the residual space RS may be different at each gate trench GT of the cell. Thus, the sacrificial layer 500a filling the residual space RS may have a relatively small height in the high density area HD and have a relatively large height in the low density area LD on the substrate 100 according to the transistor density and the size of the residual space RS. That is, the sacrificial layer 500a may have a step d between the high density area HD and the low density area LD of the substrate 100.

In an implementation, the sacrificial layer 500a may be formed to have a thickness over about 1,400 μm so that the step d of the sacrificial layer 500a is minimized, which may help to increase polishing accuracy in a subsequent planarization process.

Figure 1D:
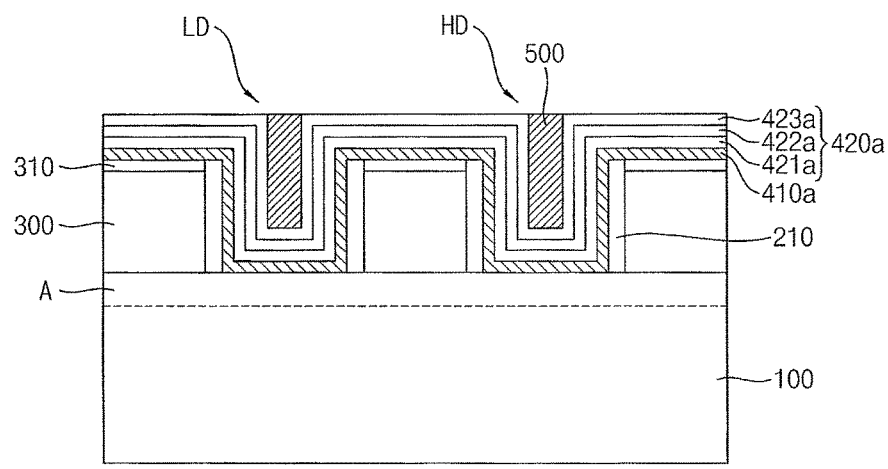

Referring to FIG. 1D, the sacrificial layer 500a may be planarized by a planarization process in such a way that the insulation pattern 300 may not be exposed and the sacrificial layer 500a may remain just in the residual space RS, thereby forming an sacrificial pattern 500 in the gate trench GT.

For example, the sacrificial layer 500a may be planarized by a chemical mechanical polishing (CMP) process and thus the step d of the sacrificial layer 500a may disappear. For example, the CMP process to the sacrificial layer 500a may be performed in such a way that the insulation pattern 300 may not be exposed. For example, the slurry composition of the CMP may be controlled in such a way that one of first to third metal layers 421a to 423a, the gate dielectric layer 410a, and the protection pattern 310 may be selected as a planarization stop layer.

For example, the slurry for the CMP process may include a polishing particle of about 0.001 weight percent (wt %) to about 5 wt %, an oxidizing agent of about 0.1 wt % to about 5 wt %, a polishing regulator of about 0 wt % to about 5 wt %, a surfactant of about 0 wt % to about 3 wt %, a pH controller of about 0 wt % to about 3 wt % and de-ionized water of about 79 wt % to about 99.889 wt %.

The polishing particle may include one of silica ($SiO_2$), ceria ($CeO_2$) and alumina ($Al_2O_3$) and have diameters of about 10 nm to about 100 nm, for example, about 30 nm to about 80 nm. The oxidizing agent may include one of chlorite and chlorate and may oxidize the sacrificial layer 500a so as to obtain a stable polishing rate. The polishing regulator may include organic or inorganic acids and may cut carbon chains off from organics in the slurry mixture. The surfactant may improve wettability of the slurry with respect to the sacrificial layer 500a to thereby improve the polishing rate. The pH controller may control an overall pH of the slurry.

Variation of the slurry composition may change the polishing selectivity between the sacrificial layer 500a and the planarization stop layer, so that one of the work function metal layer 420a, the gate dielectric layer 410a and the protection pattern 310 may be selected as the planarization stop layer for the CMP process by changing the slurry composition. For example, when the protection pattern 310 is selected as the planarization stop layer, the slurry for the CMP may have such a composition that the polishing selectivity between the sacrificial layer 500a and the protection pattern 300 may be over about 40.

In the present example embodiment, the sacrificial layer 500a may be polished at a rate of about 120 µm/min to about 140 µm/min. When the polishing rate is smaller than about 120 µm/min, the CMP process may take a large process time and the efficiency of the CMP process may decrease. In contrast, when the polishing rate is larger than about 140 µm/min, it may be difficult to maintain accurate control of the CMP process due to a high CMP rate. Therefore, the CMP process for planarizing the sacrificial layer 500a may be in a range of about 120 µm/min to about 140 µm/min.

The gate dielectric pattern and the work function metal pattern may have different shape and configuration according to the planarization stop layer of the CMP process.

In the present example embodiment, the work function metal layer 420a may be selected as the planarization stop layer for the CMP process. For example, the polishing selectivity and the polishing rate of the CMP process may be controlled by changing the slurry composition in such a way that the sacrificial layer 500a may be polished until the third metal layer 423a is exposed.

Accordingly, the sacrificial layer 500a may remain just in the residual space RS of the gate trench GT and may be separated by a unit of the cell, thereby forming the sacrificial pattern 500.

Figure 1E:
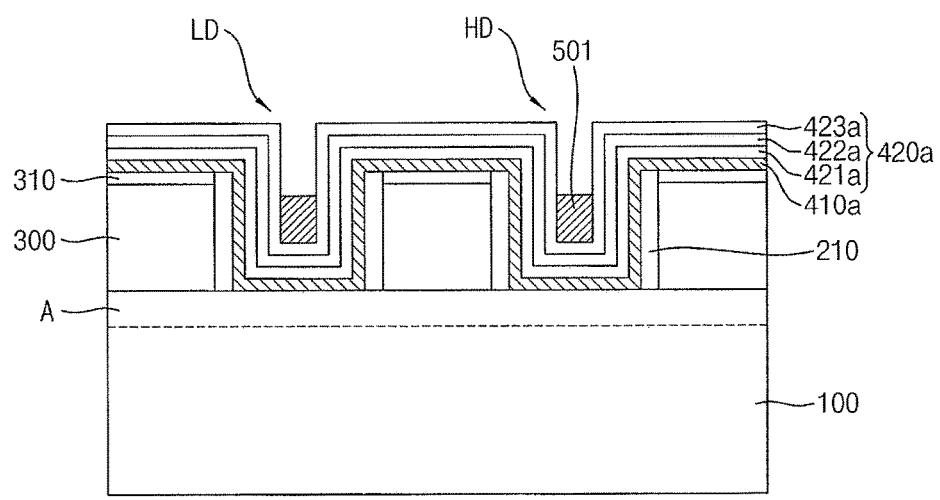

Referring to FIG. 1E, an upper portion of the sacrificial pattern 500 may be removed from the substrate 100, thereby forming a residual sacrificial pattern 501 at a lower portion of the gate trench GT. For example, the upper portion of the sacrificial pattern 500 may be removed by an ashing process or an etching process having an etching selectivity with respect to the third metal layer 423a. Thus, the sacrificial pattern 500 may remain at a lower portion of the residual space RS while an upper portion of the residual space RS may be opened again, thereby forming the residual sacrificial pattern 501 at the lower portion of the residual space RS.

Figure 1F:
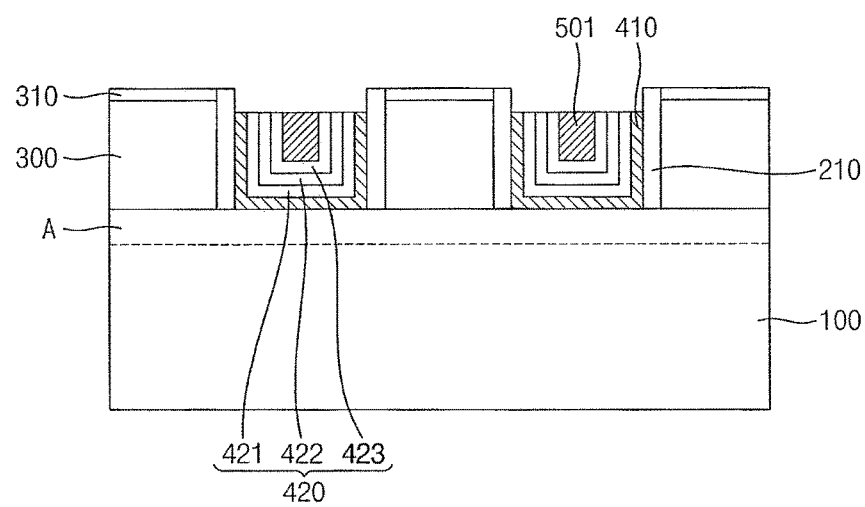

Referring to FIG. 1F, the work function metal layer 420a and the gate dielectric layer 410a may be sequentially removed from the substrate 100 in such a way that the work function metal layer 420a and the gate dielectric layer 410a may remain just in the gate trench GT, thereby forming the work function metal pattern 420 and the gate dielectric pattern 410 along the sidewalls and the bottom of the gate trench GT. For example, the work function metal layer 420a and the gate dielectric layer 410a may be etched off from the substrate 100 by an etching process having a sufficient selectivity with respect to the protection pattern 310. For example, the residual sacrificial pattern 501 may function as an etch stop layer for the etching process, so that the upper surfaces of the work function metal pattern 420 and the gate dielectric pattern 410 may be coplanar with an upper surface of the residual sacrificial pattern 501 and may be below the upper surface of the insulation pattern 300.

According to a general process for forming the semiconductor devices, the CMP process may not be performed to the sacrificial layer 500a before performing the etching process to the work function metal layer 420a and the gate dielectric layer 410a, and, as such, the step d of the sacrificial layer 500a may be transcribed onto the work function metal pattern 420 and the gate dielectric pattern 410. Thus, the height of the work function metal pattern 420 and the gate dielectric pattern 410 in the high density area HD may be different from that of the work function metal pattern 420 and the gate dielectric pattern 410 in the low density area LD, which may result in non-uniformity of the threshold voltage in the transistors of the high density area HD and of the low density area LD.

However, according to the present example embodiment, the CMP process may be performed on the sacrificial layer 500a prior to the etching process to the work function metal layer 420a and the gate dielectric layer 410a, and thus the step d of the sacrificial layer 500a may not be transcribed to the work function metal pattern 420 and the gate dielectric pattern 410, and thus the height of the work function metal pattern 420 and the gate dielectric pattern 410 may be uniform along a whole surface of the substrate 100 including the high density area HD and the low density area LD, which may help improve the uniformity of the threshold voltage of the transistors in the substrate 100.

Further, the insulation pattern 300 may be protected from the CMP process on the sacrificial layer 500a and the etching process to the work function metal layer 420a and the gate dielectric layer 410a, and thus the height of the insulation pattern 300 may be maintained or unchanged in the CMP process and the etching process. Since the height of the gate electrode may be determined by the height of the insulation pattern 300, height reduction of the gate electrode may be reduced or prevented due to the maintenance of the height of the insulation pattern 300 in the CMP process and the etching process.

For example, when the gate electrodes of the semiconductor devices are formed on the substrate 100 by using the same material, the threshold voltages of each gate electrode may be varied by the height of the gate electrode as well as the thickness of the work function metal pattern. Thus, when the height uniformity of the gate electrodes improves in the semiconductor devices, the variation of the threshold voltages caused by the height differences of the gate electrodes may be sufficiently minimized and the threshold voltages may be controlled just by the thickness variation of the work function metal pattern of the gate electrode. Therefore, the threshold voltages of the multilevel devices may be obtained with high stability and reliability.

Figure 1G:
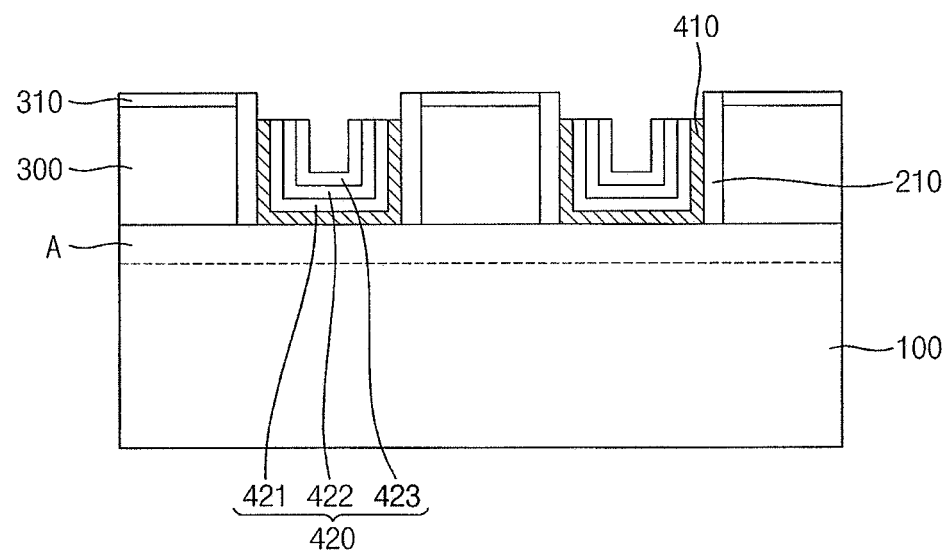

Referring to FIG. 1G, the residual sacrificial pattern 501 may be removed from the substrate 100 and the residual space RS may be opened again. As a result, the gate trench GT may be defined by the work function metal pattern 420 at a lower portion and may be defined by the gate spacer 210 at an upper portion. For example, the residual sacrificial pattern 501 may be removed by an ashing process using oxygen ($O_2$) or by a wet etching process.

Figure 1H:
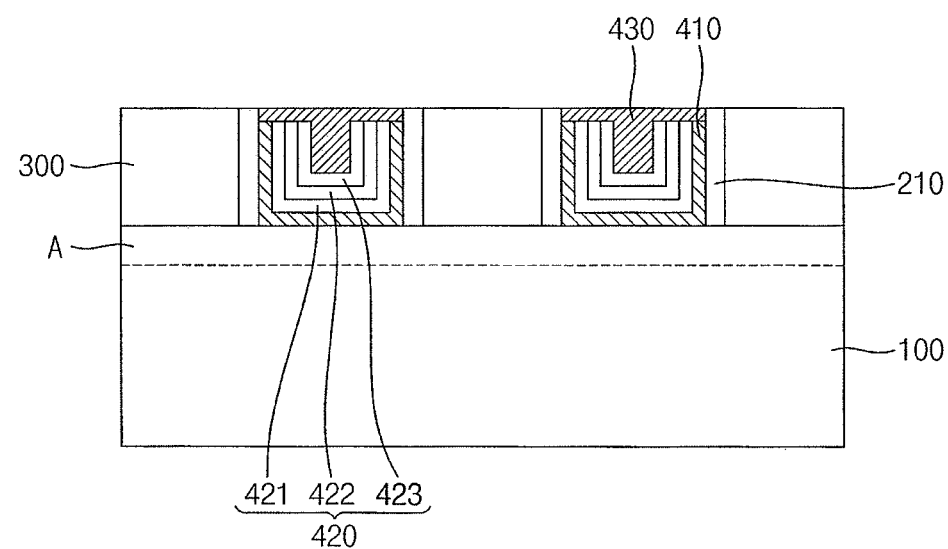

Referring to FIG. 1H, low-resistive conductive materials may be filled into the gate trench GT, thereby forming a gate conductive pattern 430 in the gate trench GT. For example, a gate conductive layer (not shown) including the low-resistive conductive material may be formed on the protection pattern 310, the gate dielectric pattern 410 and the work function metal pattern 420 to a sufficient thickness to fill up the gate trench GT. Then, the gate conductive layer may be planarized by a planarization process until the insulation pattern 300 is exposed, thereby forming the gate conductive pattern 430 in the gate trench GT in such a way that an upper surface of the gate conductive pattern 430 may be coplanar with the upper surface of the insulation pattern 300.

The protection pattern 310 may be partially etched off from the substrate 100 in the etching process for forming the work function metal pattern 420 and the gate dielectric pattern 410, and may be fully removed from the substrate 100 in the planarization process for forming the gate conductive pattern 430. Accordingly, the removal of the insulation pattern 300 may be minimized in the planarization process for forming the gate conductive pattern 430, thereby minimizing the height loss of the gate conductive pattern 430.

Figure 2A:
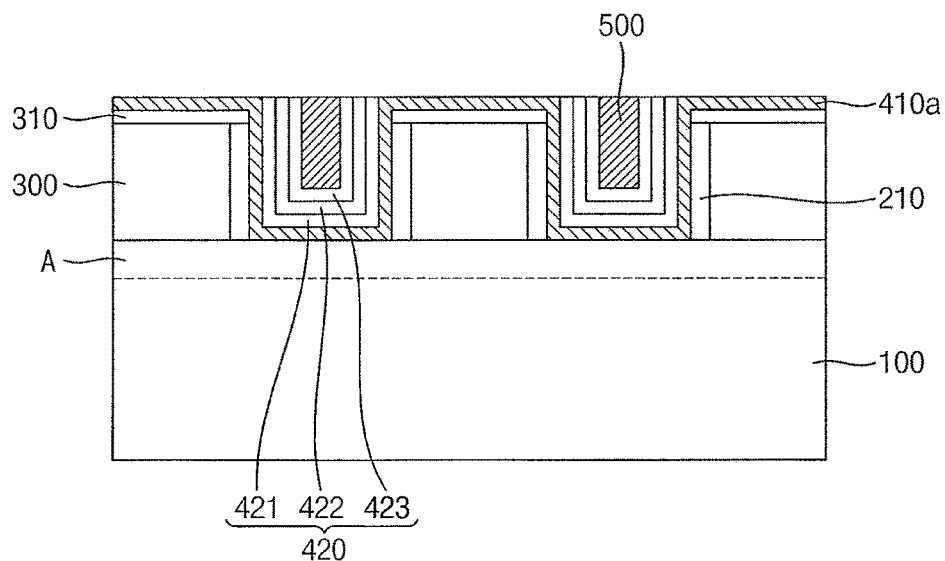
FIG. 2A to 2C illustrate cross-sectional views of stages in a method of manufacturing semiconductor devices in accordance with another example embodiment.
Figure 2B:
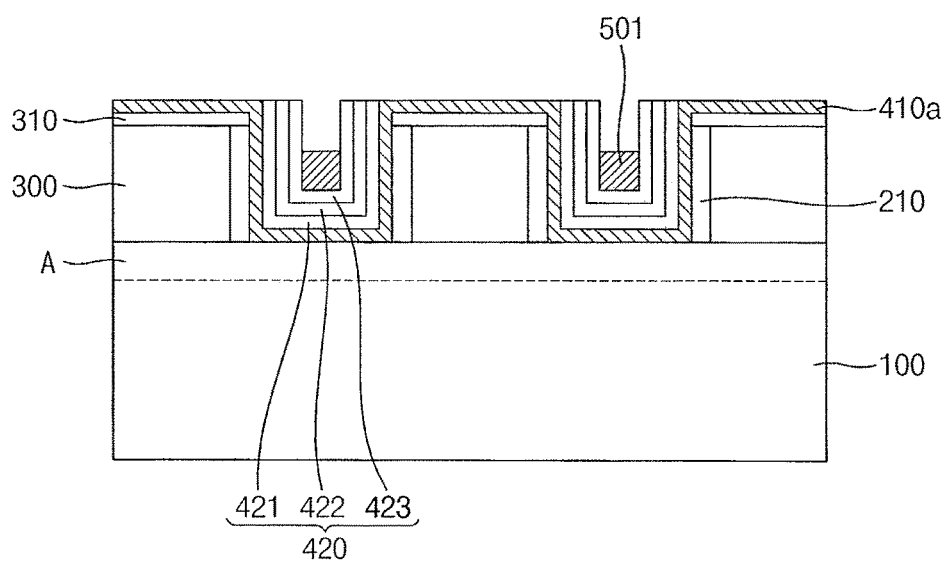
Figure 2C:
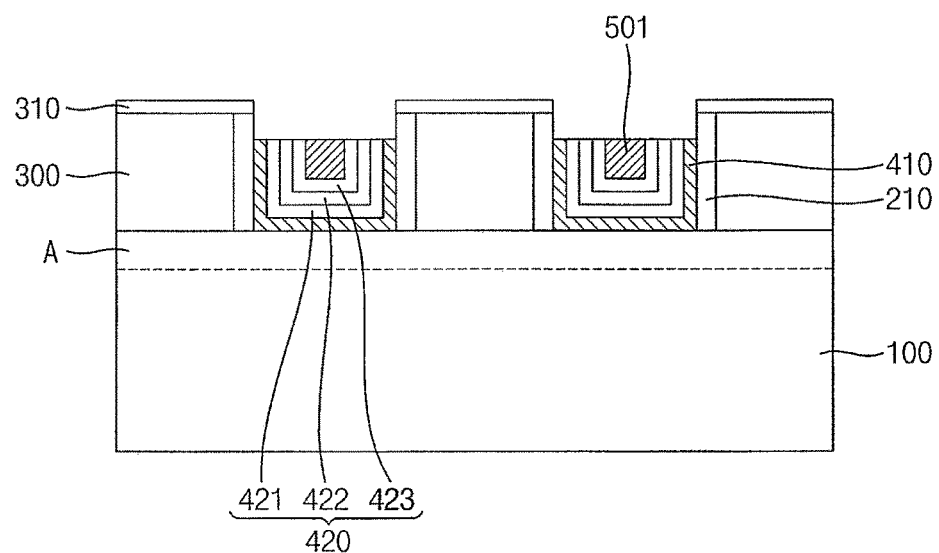

FIG. 2A to 2C are cross-sectional views of stages in a method of manufacturing semiconductor devices in accordance with another example embodiment. In FIGS. 2A to 2C, the sacrificial pattern may be formed by a planarization process using the gate dielectric layer as the planarization stop layer.

Referring to FIG. 2A, the sacrificial layer 500a and the work function metal layer 420a may be simultaneously planarized by a planarization process such as the CMP until the gate dielectric layer 410a is exposed, thereby forming the sacrificial pattern 500 and the work function metal pattern 420 of which the upper surfaces may be coplanar with an upper surface of the gate dielectric layer 410a. Thus, the sacrificial layer 500a and the work function metal layer 420a may be simultaneously node-separated by the planarization process and the gate trench GT may be filled up with the gate dielectric layer 410a, the work function metal pattern 420 and the sacrificial pattern 500. In such a case, the compositions of the slurry and the polishing rate of the CMP process may be controlled for using the gate dielectric layer 410a as the planarization stop layer.

Referring to FIG. 2B, an upper portion of the sacrificial pattern 500 may be removed from the substrate 100, thereby forming a residual sacrificial pattern 501 at a lower portion of the gate trench GT. For example, the sacrificial pattern 500 may be removed by an ashing process or an etching process having an etching selectivity with respect to the third metal pattern 423. Thus, the sacrificial pattern 500 may remain at a lower portion of the residual space RS while an upper portion of the residual space RS may be opened again, thereby forming the residual sacrificial pattern 501 at the lower portion of the residual space RS.

Referring to FIG. 2C, the gate dielectric layer 410a may be simultaneously removed from the substrate 100 together with the work function metal pattern 420, thereby forming the gate dielectric pattern 410 in the gate trench GT. For example, the gate dielectric pattern 410 and the work function metal pattern 420 may have the same upper surface that may be coplanar with the upper surface of the residual sacrificial pattern 501. For example, the gate dielectric layer 410a may be etched off from the substrate 100 together with the work function metal pattern 420 by an etching process having a sufficient selectivity with respect to the protection pattern 310 and using the residual sacrificial pattern 501 as an etch stop layer. Thus, the gate dielectric pattern 410 and the work function metal pattern 420 may have the same height below the upper surface of the insulation pattern 300.

Figure 3A:
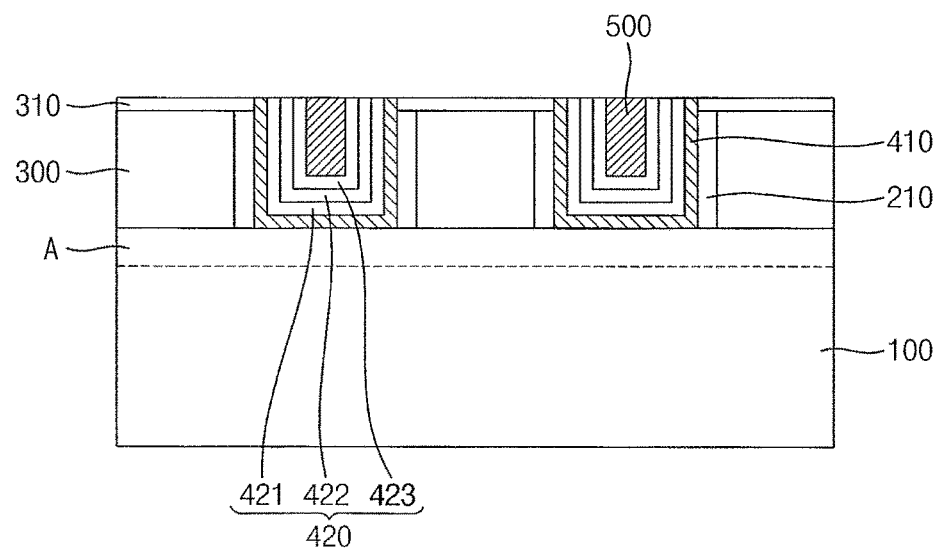
FIG. 3A to 3C illustrate cross-sectional views of stages in a method of manufacturing semiconductor devices in accordance with still another example embodiment.
Figure 3B:
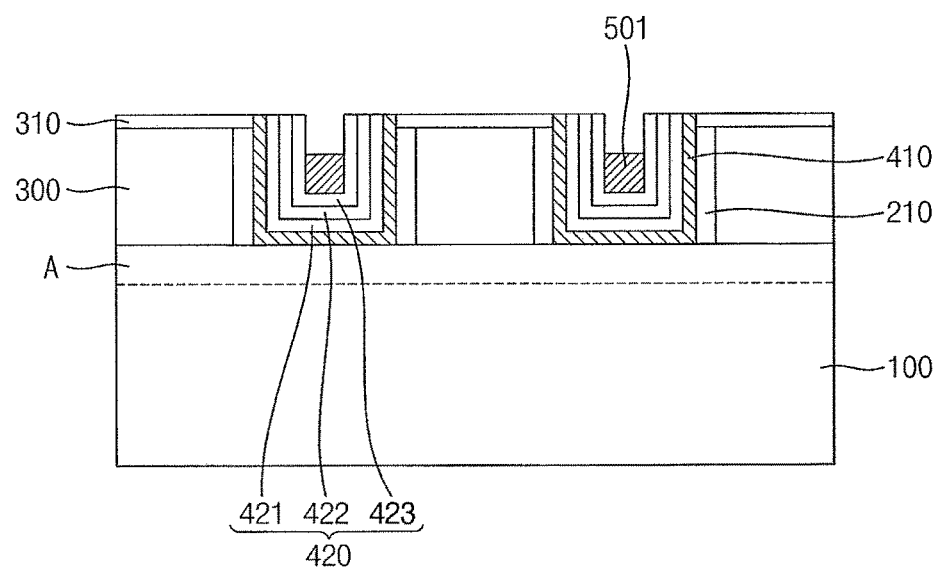
Figure 3C:
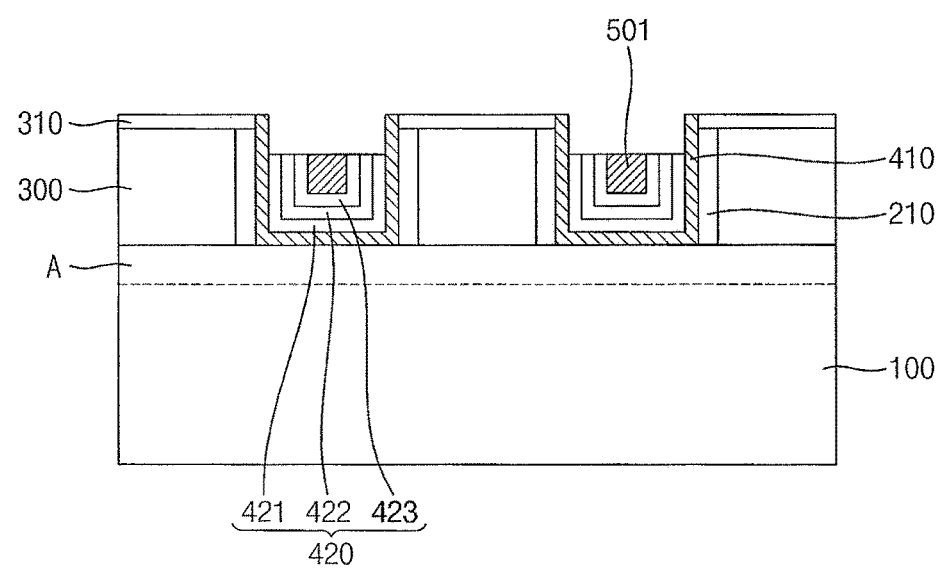

FIG. 3A to 3C are cross-sectional views of stages in a method of manufacturing semiconductor devices in accordance with still another example embodiment. In FIGS. 3A to 3C, the sacrificial pattern may be formed by a planarization process using the protection pattern 310 as the planarization stop layer.

Referring to FIG. 3A, the sacrificial layer 500a, the gate dielectric layer 410a and the work function metal layer 420a may be simultaneously planarized by a planarization process such as the CMP until the protection pattern 310 including silicon nitride may be exposed, thereby forming the sacrificial pattern 500, the gate dielectric pattern 410 and the work function metal pattern 420 of which the upper surfaces may be coplanar with an upper surface of the protection pattern 310.

Thus, the gate dielectric layer 410a and the work function metal layer 420a may be simultaneously node-separated by the planarization process as well as the sacrificial layer 500a, and the gate trench GT may be filled up with the gate dielectric pattern 410, the work function metal pattern 420 and the sacrificial pattern 500. Therefore, the gate dielectric pattern 410 may not necessarily undergo the etching process for reducing the height of the work function metal pattern 420. In such a case, the compositions of the slurry and the polishing rate of the CMP process may be controlled for using the protection pattern 310 as the planarization stop layer.

Referring to FIG. 3B, an upper portion of the sacrificial pattern 500 may be removed from the substrate 100, thereby forming a residual sacrificial pattern 501 at a lower portion of the gate trench GT. For example, the sacrificial pattern 500 may be removed by an ashing process or an etching process having an etching selectivity with respect to the third metal pattern 423. Thus, the sacrificial pattern 500 may remain at a lower portion of the residual space RS while an upper portion of the residual space RS may be opened again, thereby forming the residual sacrificial pattern 501 at the lower portion of the residual space RS.

Referring to FIG. 3C, the work function metal pattern 420 may be partially removed from the substrate 100 in such a way that an upper surface of the work function metal pattern 420 may be coplanar with the upper surface of the residual sacrificial pattern 501.

For example, the work function metal pattern 420 may be etched off from the substrate 100 by an etching process having a sufficient selectivity with respect to the gate dielectric pattern 410 and/or the protection pattern 310 and using the residual sacrificial pattern 501 as an etch stop layer. Thus, the work function metal pattern 420 may have the same upper surface as the residual sacrificial pattern 501 and the gate dielectric pattern 410 may have the same upper surface as the protection pattern 310. Therefore, the sidewalls of the gate trench GT may be covered by the gate dielectric pattern 410.

FIGS. 4A to 4M are cross-sectional views of stages in a method of manufacturing finFET devices in accordance with an example embodiment. In FIGS. 4A to 4M, the manufacturing processes are substantially the same as those described in detail with reference to FIGS. 1 to 3C, except for manufacturing the finFET devices as the semiconductor devices. Thus, the same reference numerals in FIGS. 4A to 4M denote the same elements in FIGS. 1 to 3C, and any further detailed descriptions on the same elements will not be repeated.

Figure 4A:
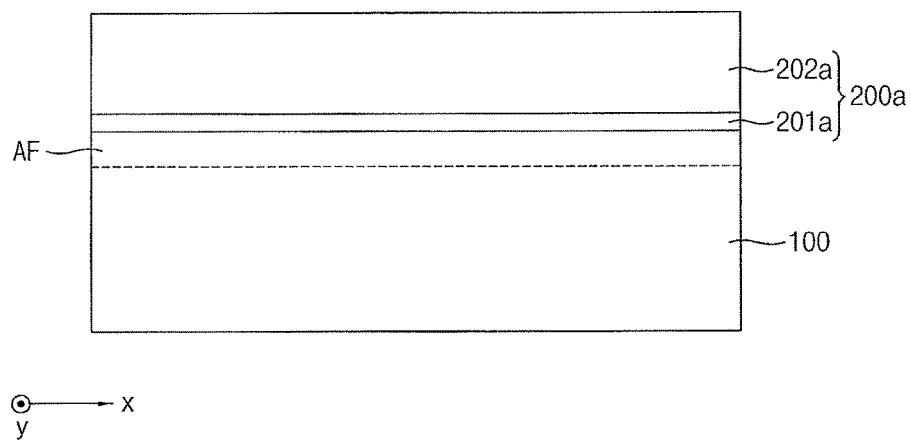
FIGS. 4A to 4M illustrate cross-sectional views of stages in a method of manufacturing fin FET devices in accordance with an example embodiment.
Figure 4B:
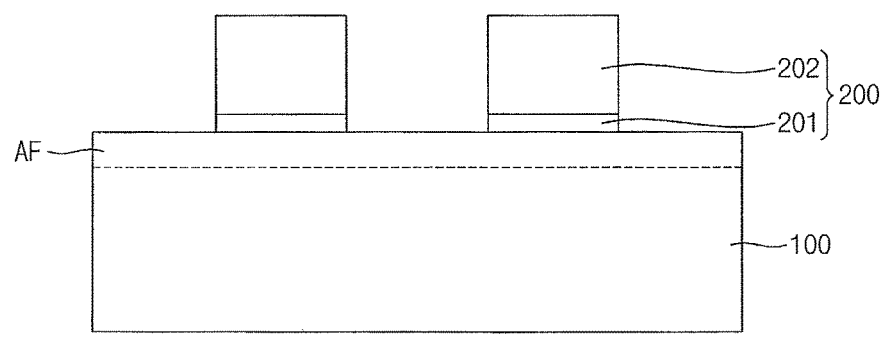
Figure 4C:
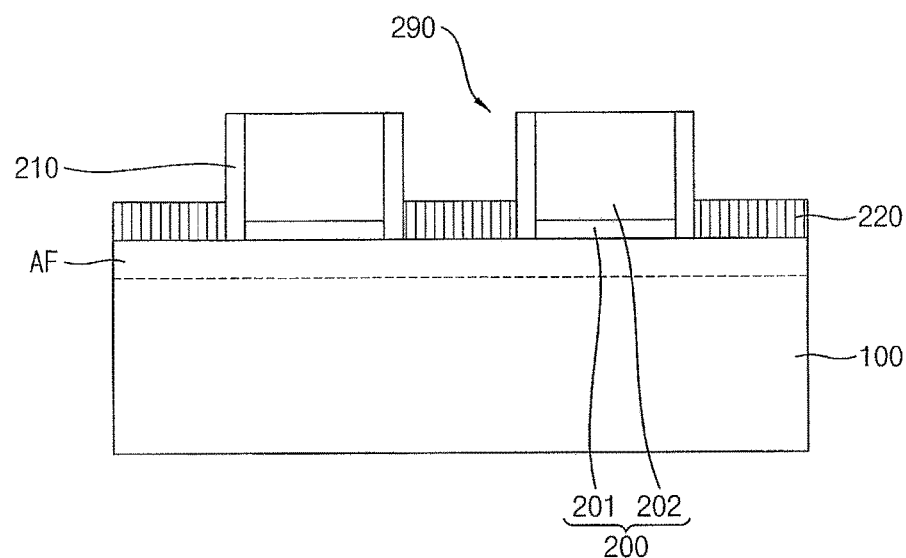

Referring to FIGS. 4A to 4C, a preliminary gate structure 290 may be formed on the substrate 100 in such a configuration that source/drain junctions 220 may be formed at surface portions of the active fin AF and may be separated from a dummy gate line 200 by the gate spacer 210.

Referring to FIG. 4A, a dummy gate structure 200a may be formed on the substrate 100 in such a way that the active fin AF may be covered with the dummy gate structure 200a.

For example, a device isolation trench (not shown) may be formed on the substrate 100 and a device isolation layer may be formed in the device isolation trench. For example, an isolation layer may be formed on the substrate 100 to a sufficient thickness to fill up the device isolation trench and then may be planarized until an upper surface of the substrate 100 is exposed. Thereafter, an upper portion of the device isolation layer may be removed from the substrate 100, so that some portion of the substrate 100 may be protruded from the device isolation layer. The isolation layer may include silicon oxide or silicon nitride.

The protruded portion of the substrate 100 defined by the device isolation layer may be provided as the active region A that may be called as the active fin AF. In the present example embodiment, the active fin AF may be shaped into the line extending in the first direction x.

In another implementation, when a substrate insulator may be provided with the substrate 100 such as a silicon-on-insulator (SOI) substrate, an upper substrate may be partially removed from the substrate 100 until the substrate insulator may be exposed, and the residuals of the upper substrate may be provided as the active fin AF.

Then, a dummy gate insulation layer 201a and a dummy gate layer 202a may be sequentially formed on the substrate 100, thereby forming the dummy gate structure 200a on the substrate 100 in such a way that the active fin AF and the device isolation layer may be covered with the dummy gate structure 200a.

Then, as shown in FIG. 4B, a gate mask pattern (not shown) for forming a gate line or the gate trench GT may be formed on the dummy gate layer 202a and then the dummy gate structure 200a may be etched by an etch process using the gate mask pattern as an etching mask, thereby forming a dummy gate line 200 on the substrate 100 in a second direction y perpendicular to the first direction x.

Accordingly, the dummy gate line 200 may include a dummy gate insulation pattern 201 and a dummy gate electrode 202 that may be sequentially stacked on the substrate 100. Since the dummy gate line 200 may extend in the second direction y and the active fin AF may extend in the first direction x, the active fin AF between the neighboring dummy gate lines 200 may be partially exposed to surroundings.

Referring to FIG. 4C, the gate spacer 210 may be formed on both sidewalls of the dummy gate line 200 and the source/drain junctions 220 may be formed at the surface portions of the active fin AF around the gate spacer 210. Thus, the source/drain junctions 220 and the dummy gate line 200 may be separated by the gate spacer 210.

For example, a spacer layer (not shown) including silicon nitride may be formed on the substrate 100 to a sufficient thickness to cover the dummy gate line 200, and may be etched off from the substrate 100 by an anisotropic etching process in such a way that the spacer layer may remain on the sidewalls of the dummy gate line 200, thereby forming the gate spacer 210 on the sidewalls of the dummy gate line 200.

Then, the source/drain junctions 220 may be formed at the surface portions of the active fin AF that may be defined by the gate spacer 210. For example, the active fin AF may be partially removed from the substrate 100, thereby forming a recess (not shown) on the active fin AF between the gate spacers 210. An epitaxial pattern may be formed in the recess of the active fin AF by a selective epitaxial growth (SEG) process and then p-type or n-type impurities may be implanted onto the epitaxial pattern by an ion implantation process, thereby forming the source/drain junctions 220 on the active fin AF. The impurities may be implanted in-situ with the SEG process, so that the source/drain junctions 220 may be simultaneously formed together with the epitaxial pattern.

Therefore, the preliminary gate structure 290 may be formed on the substrate 100 in such a configuration that the source/drain junctions 220 may be formed at surface portions of the active fin AF extending in the first direction x, and may be separated from a dummy gate line 200 by the gate spacer 210 extending in the second direction y.

Figure 4D:
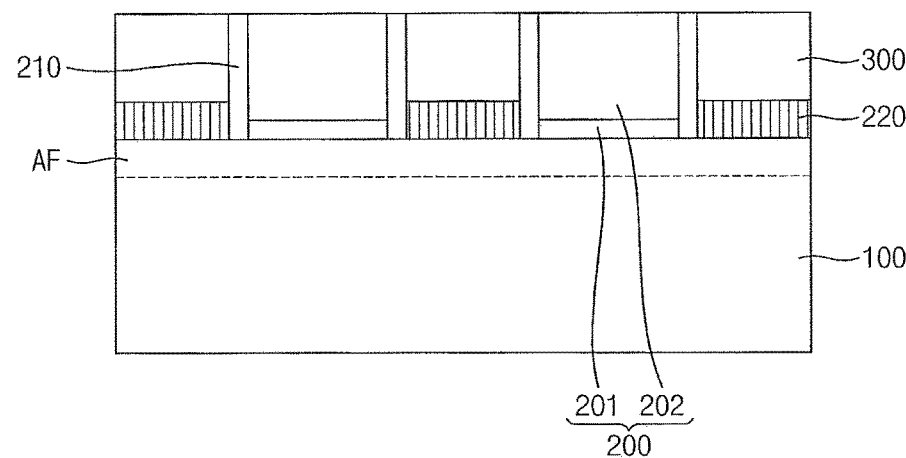

Referring to FIG. 4D, an insulation interlayer pattern 300 may be formed on the substrate 100 in such a configuration that the source/drain junction 220 may be covered by the insulation interlayer pattern 300 and the dummy gate line 200 and the gate spacer 210 may be exposed through the insulation interlayer pattern 300.

For example, a lower insulation interlayer (not shown) may be formed on the substrate 100 to a sufficient thickness to cover the dummy gate line 200, the gate spacer 210, the active fin AF and the device isolation layer and may be planarized by a planarization process until the dummy gate line 200 and the gate spacer 210 may be exposed. Thus, the lower insulation interlayer may remain on the source/drain junction 220 and fill up the gap spaces between the neighboring gate spacers 210, thereby forming the insulation interlayer pattern 300. The planarization process may include one of a CMP process and an etch-back process. The lower insulation interlayer may include silicon oxide.

Figure 4E:
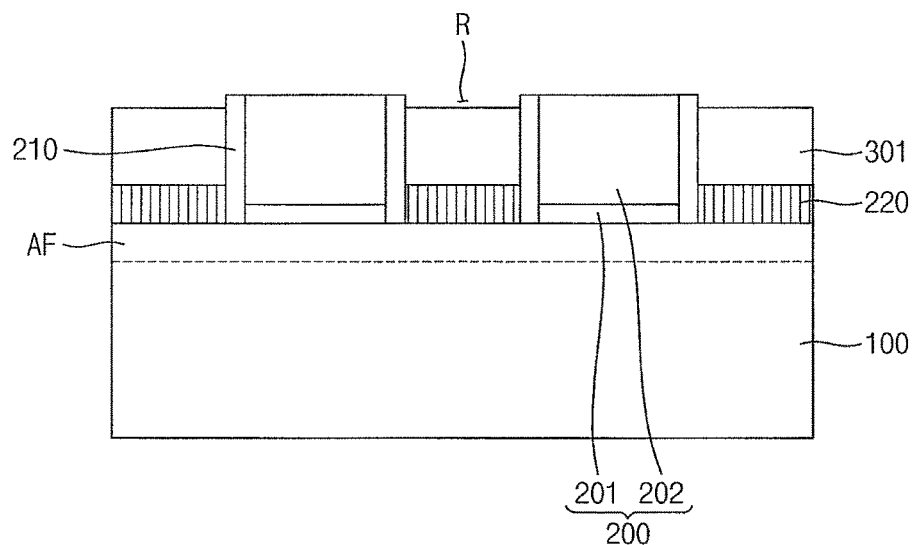

Referring to FIG. 4E, an upper portion of the insulation interlayer pattern 300 may be slightly removed from the substrate 100, to thereby form an inter-spacer recess R on the insulation interlayer pattern 300.

For example, the insulation interlayer pattern 300 may be etched off by an etching process having an etching selectivity with respect to the gate spacer 210 and the dummy gate electrode 201.

In the present example embodiment, the insulation interlayer pattern 300 may include silicon oxide, and the gate spacer 210 and the dummy gate electrode 201 may include polysilicon, so that a reactive ion etch (RIE) may be performed to the substrate 100 for a relatively short time and an upper portion of the insulation interlayer pattern 300 may be removed in such a way that the insulation interlayer pattern 300 may be below an upper surface of the gate spacer 210.

Therefore, the inter-spacer recess R may be defined by the neighboring gate spacers 210 and the insulation interlayer pattern 300 may be formed into a reduced interlayer pattern 301 of which the upper surface may be below the upper surface of the gate spacer 210.

Figure 4F:
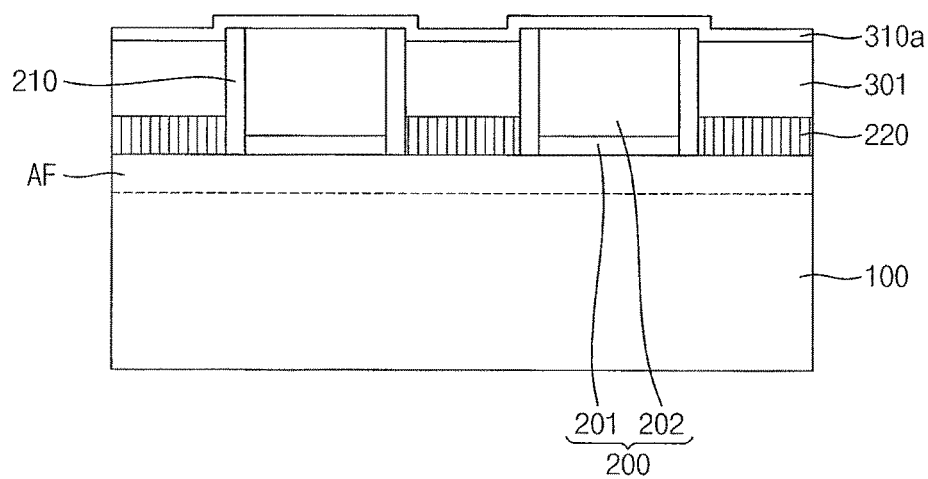

Referring to FIG. 4F, a protection layer 310a may be formed on the substrate 100 along a surface profile of the inter-gate recess R. For example, the protection layer 310a may include silicon nitride, and be formed on a whole surface of the substrate 100 having the inter-gate recess R by an atomic layer deposition (ALD) process.

Figure 4G:
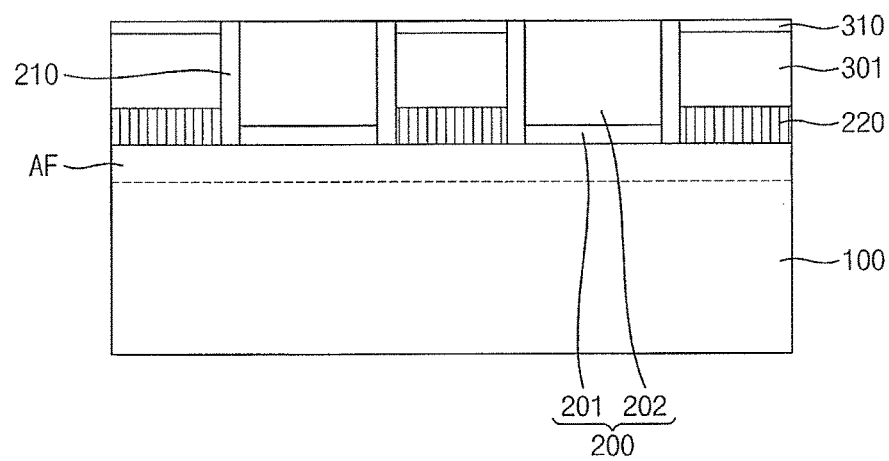

Referring to FIG. 4G, the protection layer 310a may be planarized by a planarization process until the dummy gate line 200 and the gate spacer 210 are exposed, so that the protection layer 310a may remain just in the inter-gate recess R, thereby forming the protection pattern 310 of which the upper surface may be coplanar with an upper surface of the gate spacer 210 and the dummy gate electrode 201. The planarization process may include a CMP process and an etch-back process.

Accordingly, the reduced interlayer pattern 301 may be covered by the protection pattern 310 and the gate spacer 210 and the dummy gate line 200 may be exposed through the protection pattern 310.

Figure 4H:
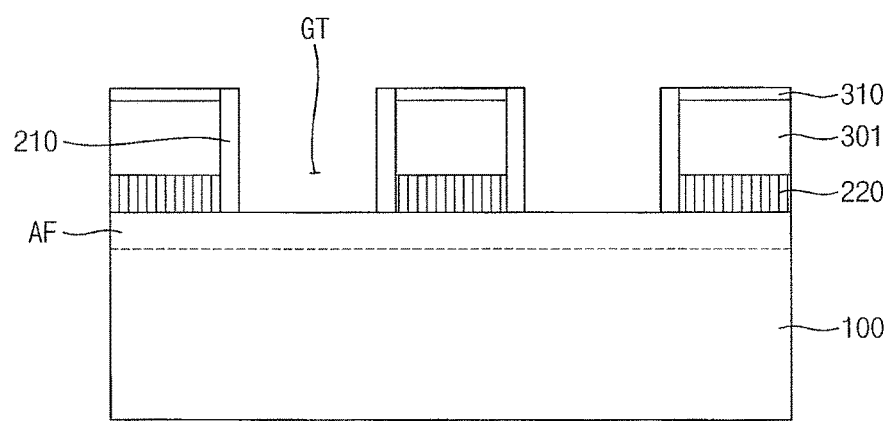
Figure 4I:
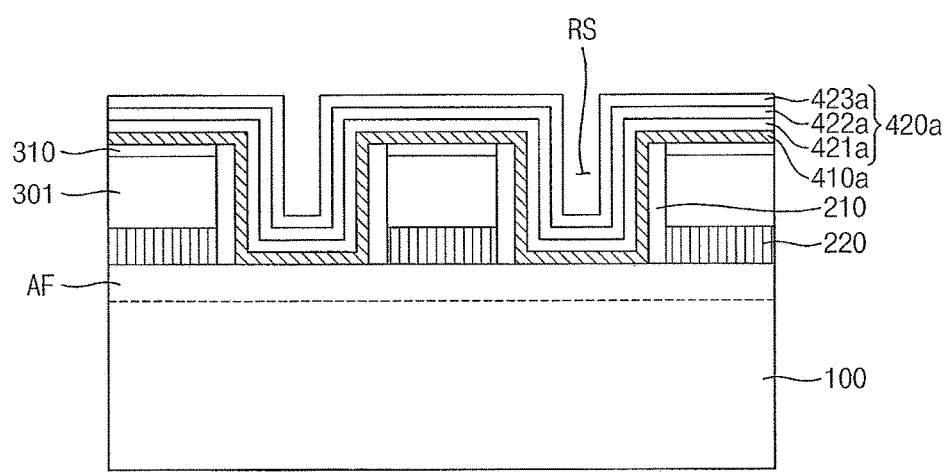
Figure 4J:
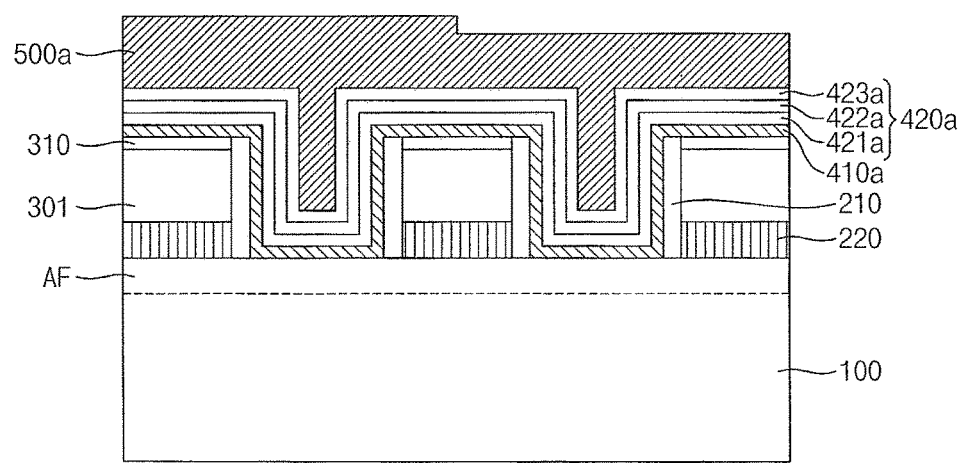
Figure 4K:
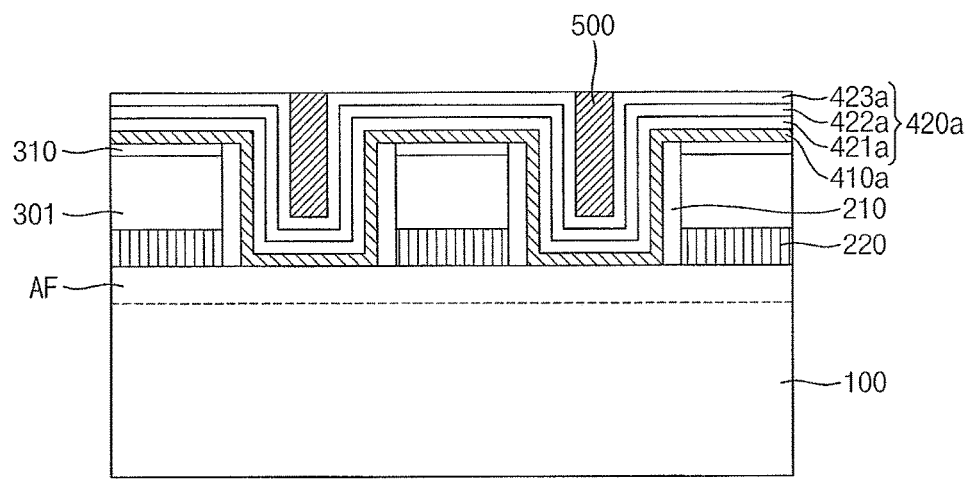
Figure 4L:
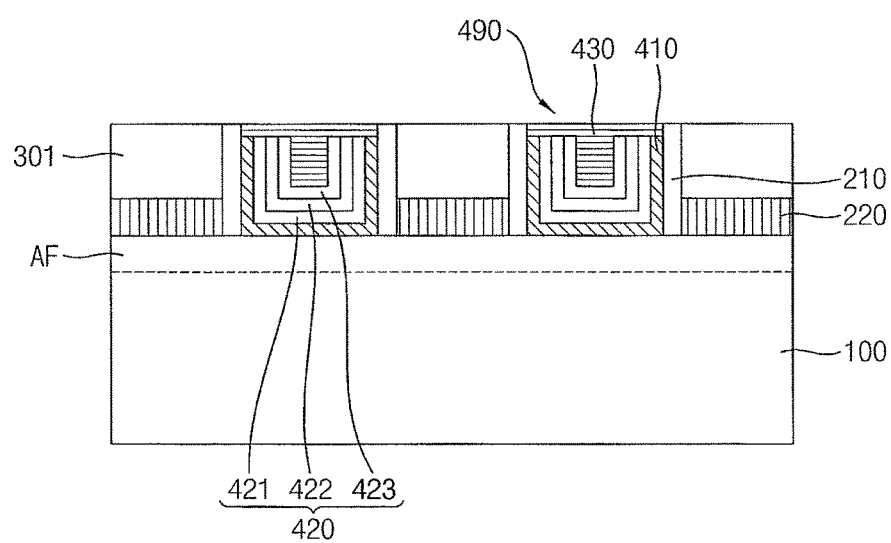
Figure 4M:
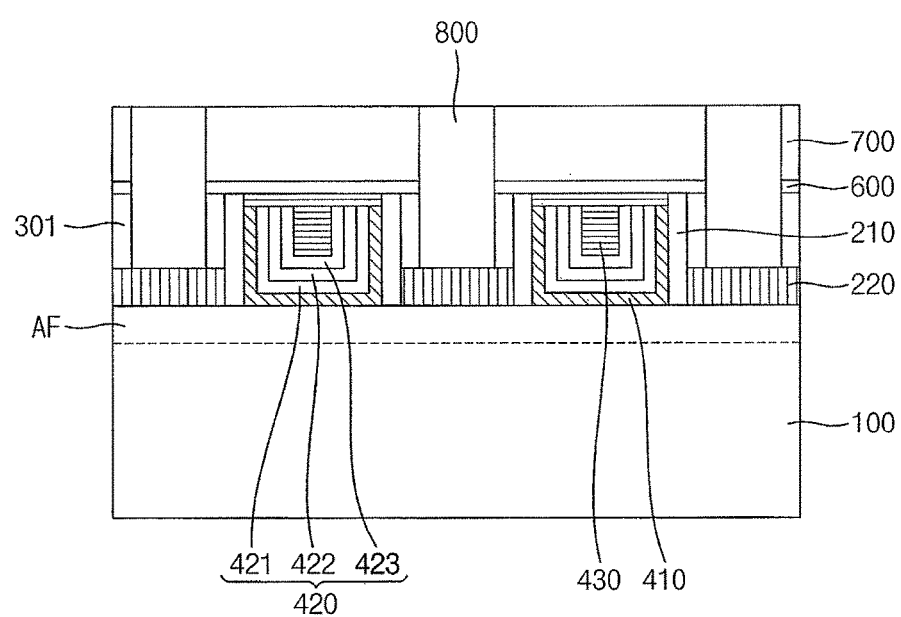

Referring to FIG. 4H, the dummy gate line 200 may be removed from the substrate 100 to thereby form the gate trench GT through which the active fin AF may be partially exposed.

For example, the dummy gate line 200 may be removed by an etching process having selectivity with respect to the protection pattern 310 and the gate spacer 210, and the active fin AF under the dummy gate line 200 may be exposed through the gate trench T extending in the second direction y substantially perpendicular to the active fin AF. Since the dummy gate line 200 may include polysilicon and the protection pattern 310 and the gate spacer 210 may include silicon nitride, a wet etching process using an SC-1 solution as an etchant may be used for removing the dummy gate line 200.

Then, as illustrated in FIGS. 4I to 4L, the gate dielectric layer 410a and the work function metal layer 420a may be sequentially formed on the substrate 100 along a surface profile of the gate trench GT. The sacrificial layer 500a may be formed on the work function metal layer 420a to a sufficient thickness to fill up the gate trench GT.

Thereafter, the sacrificial layer 500a may be planarized by a planarization process such that the reduced interlayer pattern 301 and the gate spacer 210 are not exposed by the planarization process, thereby forming the sacrificial pattern 500 in the gate trench GT. Then, the work function metal layer 420a and the gate dielectric layer 410a may be node-separated by an etching process, thereby forming the work function metal pattern 420 and the gate dielectric pattern 410 in the gate trench GT. The sacrificial pattern 500 may be formed into the residual sacrificial pattern that may be arranged at a lower portion of the gate trench GT and the work function metal pattern 420 or both of the work function metal pattern 420 and the gate dielectric pattern 410 may be reduced in such a way that upper surfaces of the work function metal pattern 420 and the gate dielectric pattern 410 may be coplanar with the residual sacrificial pattern 501. Thereafter, the residual sacrificial pattern 501 may be removed from the substrate 100 and the re-opened residual space RS of the gate trench GT may be filled up with the gate conductive pattern 430, thereby forming a gate structure 490 having the gate dielectric pattern 410, the work function metal pattern 420 and the gate conductive pattern 430. For example, the gate conductive pattern may be filled into the gate trench GT in such a configuration that the work function metal pattern 420 may be covered by the gate conductive pattern 430.

The processing steps for forming the gate structure 490 may be substantially the same as the process described in detail with reference to FIGS. 1B to 1H, thus any detailed descriptions on the processing steps for forming the gate structure 490 will not be repeated.

While the present example embodiment discloses that the work function metal layer 420a may be used as a planarization stop layer for the planarization process in which the sacrificial layer 500a may be removed, the gate dielectric layer 410a and the protection pattern 310 may also be used s the planarization stop layer for the planarization process as described above in detail with reference to FIGS. 2A to 2C and FIGS. 3A to 3C.

Therefore, the gate dielectric pattern 410 and the work function metal pattern 420 may be formed by various processes.

In an example embodiment, the sacrificial layer 500a may be formed into the sacrificial pattern 500 by the planarization process in which the work function metal layer 420a may be used as the planarization stop layer. Then, the sacrificial pattern may be partially removed from the substrate, thereby forming the residual sacrificial pattern 501 at a lower portion of the gate trench GT. Thereafter, the work function metal layer 420a may be partially removed from the substrate 100 together with the gate dielectric layer 410a by an etching process using the residual sacrificial pattern 501 as an etch stop layer, thereby forming the work function metal pattern 420 and the gate dielectric pattern 410 of which the upper surfaces may be coplanar with an upper surface of the residual sacrificial pattern 501.

In another example embodiment, the work function metal layer 420a may be removed from the substrate 100 together with the sacrificial layer 500a by the planarization process, thereby forming the work function metal pattern 420 simultaneously with the sacrificial pattern 500. Then, the sacrificial pattern 500 may be removed from the substrate 100, thereby forming the residual sacrificial pattern 501 at a lower portion of the gate trench GT and the gate dielectric layer 410a may be partially removed together with the work function metal pattern 420 by an etching process using the residual sacrificial pattern 501 as an etch stop layer, thereby forming the gate dielectric pattern 410 of which the upper surface may be coplanar with upper surfaces of the residual sacrificial pattern and the work function metal pattern 420.

In still another example embodiment, the work function metal layer 420a and the gate dielectric layer 410a may be partially removed from the substrate 100 together with the sacrificial layer 500a by a planarization process, thereby forming the gate dielectric pattern 410 and the work function metal pattern 420 simultaneously with the sacrificial pattern 500. Then, the sacrificial pattern 500 may be partially removed from the substrate 100, thereby forming the residual sacrificial pattern 501 at the lower portion of the gate trench GT and then the work function metal pattern 420 may be partially remove by an etching process using the residual sacrificial pattern 501 as an etch stop layer in such a way that an upper surface of the work function metal pattern 420 may be coplanar with an upper surface of the residual sacrificial pattern 501 while sidewalls of the gate trench GT may be covered with the gate dielectric pattern 410.

Thereafter, an etch stop layer 600, an upper insulation interlayer pattern 700 and an interconnector 800 connected to the source/drain junction 220 penetrating through the upper insulation interlayer pattern 700, the etch stop layer 600 and the reduced interlayer pattern 301 may be formed on the substrate 100 having the gate structure 490, thereby manufacturing the fin FET device.

Accordingly, when the finFET device has multilevel threshold voltages, the gate structures 490 may have a uniform height irrespective of the step d of the sacrificial layer 500a, which may help provide uniform threshold voltages with high stability and reliability in the multilevel finFET devices.

According to the example embodiments of the method of manufacturing semiconductor devices, when the sacrificial layer has a step between the high cell transistor density area HD and the low cell transistor density area LD of the substrate, a planarization process may be performed to the sacrificial layer prior to an etching process to the work function metal layer and the gate dielectric layer, and thus the step of the sacrificial layer may not be transcribed to the work function metal pattern 420 and the gate dielectric pattern 410. Therefore, the height of the work function metal pattern and the gate dielectric pattern may be uniform along a whole surface of the substrate including the high cell transistor density area HD and the low cell transistor density area, thereby improving the uniformity of the threshold voltages of the gate structures in the substrate 100.

Further, since the insulation pattern may be protected from the CMP process on the sacrificial layer and the etching process to the work function metal layer and the gate dielectric layer, the height of the insulation pattern may be maintained or unchanged in the CMP process and the etching process. Since the height of the gate electrode may be determined by the height of the insulation pattern, the height reduction of the gate electrode may be avoided due to the height maintenance of the insulation pattern in the CMP process and the etching process. For example, when the gate electrodes of the semiconductor devices are formed on the substrate using a same material, the threshold voltages of each gate electrode may be varied by the height of the gate electrode as well as the thickness of the work function metal pattern. Thus, when the height uniformity of the gate electrodes improves in the semiconductor devices, the variation of the threshold voltages caused by the height differences of the gate electrodes may be sufficiently minimized and the threshold voltages may be controlled just by the thickness variation of the work function metal pattern of the gate electrode. Therefore, the threshold voltages of the multilevel devices may be obtained with high stability and reliability.

By way of summation and review, for finFET devices in which the gate electrode is arranged on an active fin, i.e., an active region of the substrate that is protruded from a surface of the substrate like a fin, source/drain electrodes are usually provided as elevated structures and upper portions thereof may be non-uniformly removed in a planarization process for a metal gate replacement process.

In a general metal gate replacement process, a dummy gate is removed from the substrate into a gate trench, and a gate insulation layer and a work function metal layer are formed on the inner walls and the bottom of the gate trench. A sacrificial layer is formed on the work function metal layer to fill up the gate trench. Thereafter, the height of a work function metal pattern may be controlled on a basis of an upper surface of a sacrificial pattern in an etching process to the work function metal layer.

Semiconductor devices may be manufactured into multilevel devices having various threshold voltages in a single manufacturing process by a gate stack process, not by an ion implantation process. In such a case, the transistors in the same substrate may have respective work function metal layer having different composition and thickness in accordance with the corresponding threshold voltages thereof. Thus, for example, a plurality of the gate trenches having smaller widths and greater widths may be distributed on the same substrate. The categories of the trench widths may be varied according to the number of levels of the threshold voltages of the multilevel devices.

Accordingly, when the sacrificial layer is filled up into the gate trenches having different widths in the same process, the height of the sacrificial layer may be non-uniform due to the different widths of the gate trenches, and thus the height of the work function metal layer may also be non-uniform when the work function metal layer is etched off on a basis of the upper surface of the sacrificial layer.

In addition, when a planarization process for planarizing the upper portions of the sacrificial layer is performed prior to an etching process to the sacrificial layer, the gate spacer and/or the insulation interlayer tends to be removed together with the sacrificial layer in the planarization process, which causes the reduction of an overall height of the gate electrode.

In addition, when the height of the sacrificial layer becomes very small due to a large width of the gate trench, a sufficient threshold voltage may not be obtained gained in the finFET. The gate electrode in the finFET has a minimum height for covering the active fin. However, when the height of the sacrificial layer is very small, the height of the work function metal layer may be smaller than that of the active fin, and thus the gate electrode may cover the active fin.

As described above, example embodiments may provide a method of manufacturing a semiconductor device in which the height of the work function metal layer and an overall height of the gate electrode may be uniform.

According to example embodiments, when the sacrificial layer has a step between a high cell transistor density area HD and a low cell transistor density area LD of the substrate, a planarization process may be performed to the sacrificial layer prior to an etching process of the work function metal layer and the gate dielectric layer, and thus a step of the sacrificial layer may not be transcribed to the work function metal pattern 420 and the gate dielectric pattern 410. Therefore, the height of the work function metal pattern and the gate dielectric pattern may be uniform along a whole surface of the substrate including the high cell transistor density area HD and the low cell transistor density area, which may help improve the uniformity of the threshold voltages of the gate structures in the substrate 100.

Further, since the insulation pattern may be protected from the CMP process to the sacrificial layer and the etching process to the work function metal layer and the gate dielectric layer, the height of the insulation pattern may be maintained or unchanged in the CMP process and the etching process. Since the height of the gate electrode may be determined by the height of the insulation pattern, height reduction of the gate electrode may be avoided due to the height maintenance of the insulation pattern in the CMP process and the etching process. For example, when the gate electrodes of the semiconductor devices are formed on the substrate by using the same material, the threshold voltages of each gate electrode may be varied by the height of the gate electrode as well as the thickness of the work function metal pattern. Thus, when the height uniformity of the gate electrodes improves in the semiconductor devices, the variation of the threshold voltages caused by the height differences of the gate electrodes may be minimized and the threshold voltages may be controlled just by the thickness variation of the work function metal pattern of the gate electrode. Therefore, the threshold voltages of the multilevel devices may be obtained with high stability and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
   forming an insulation pattern on a substrate such that the insulation pattern is covered by a protection pattern and has a gate trench through which an active region of the substrate is partially exposed;
   sequentially forming a gate dielectric layer and a work function metal layer on the substrate along a surface profile of the gate trench such that the protection pattern is covered by the gate dielectric layer;
   forming a sacrificial layer on the work function metal layer to fill the gate trench;
   planarizing the sacrificial layer without exposing the insulation pattern to thereby form a sacrificial pattern in the gate trench;
   forming a residual sacrificial pattern in the gate trench by removing an upper portion of the sacrificial pattern; and
   partially removing the work function metal layer and the gate dielectric layer to form a gate dielectric pattern and a work function metal pattern such that upper surfaces of the gate dielectric pattern and the work function metal pattern are coplanar with an upper surface of the residual sacrificial pattern.

2. The method as claimed in claim 1, wherein planarizing the sacrificial layer is performed by a planarization process using one of the work function metal layer and the gate dielectric layer as a planarization stop layer.

3. The method as claimed in claim 2, wherein the work function metal layer is a multilayer structure including first to third metal layers, and the sacrificial layer is planarized until the third metal layer of the work function metal layer is exposed.

4. The method as claimed in claim 2, wherein the gate dielectric layer includes a high-k material having a dielectric constant greater than that of silicon oxide.

5. The method as claimed in claim 2, wherein the gate dielectric pattern and the work function metal pattern have upper surfaces that are substantially coplanar with an upper surface of the residual sacrificial pattern.

6. The method as claimed in claim 1, wherein planarizing the sacrificial layer is performed by a planarization process using the protection pattern as a planarization stop layer.

7. The method as claimed in claim 6, wherein the protection pattern includes a silicon nitride pattern that is formed on the insulation pattern by an atomic layer deposition (ALD) process.

8. The method as claimed in claim 7, wherein the work function metal pattern has an upper surface that is substantially coplanar with an upper surface of the residual sacrificial pattern.

9. The method as claimed in claim 1, wherein the sacrificial layer includes an organic layer without silicon (Si).

10. The method as claimed in claim 9, wherein the organic layer includes one of spin-on-carbon (SOC) layer and a spin-on-hard mask (SOH) layer that are coated on the substrate by a spin-on coating process.

11. A method of manufacturing a semiconductor device, the method comprising:
    forming a preliminary gate structure on a substrate, the preliminary gate structure having a dummy gate line extending in a second direction and partially covering an active fin, which is protruded from the substrate into a line extending in a first direction, and forming source/drain junctions arranged at surface portions of the active fin and separated from the dummy gate line by a gate spacer;
    forming an insulation interlayer pattern covering the source/drain junctions and exposing the dummy gate line and the gate spacer;
    forming a protection pattern on the insulation interlayer pattern;
    removing the dummy gate line from the substrate, thereby forming a gate trench through which the active fin is partially exposed;
    sequentially forming a gate dielectric layer and a work function metal layer on the substrate along a surface profile of the gate trench such that the protection pattern is covered by the gate dielectric layer;
    forming a sacrificial layer on the work function metal layer to a thickness to fill the gate trench;
    planarizing the sacrificial layer without exposing the insulation interlayer pattern and the gate spacer, thereby forming a sacrificial pattern in the gate trench;
    forming a gate dielectric pattern and a work function metal pattern in the gate trench by node-separating the gate dielectric layer and the work function metal layer by the gate trench; and
    forming a gate conductive pattern in the gate trench after a removal of the sacrificial pattern, thereby forming a gate structure having the gate dielectric pattern, the work function metal pattern, and the gate conductive pattern.

12. The method as claimed in claim 11, wherein planarizing the sacrificial layer is performed by a planarization process in which one of the protection pattern, the gate dielectric pattern, and the work function metal pattern is used as a planarization stop layer.

13. The method as claimed in claim 11, wherein forming the gate dielectric pattern and the work function metal pattern includes:
    partially removing the sacrificial pattern from the substrate, thereby forming a residual sacrificial pattern at a lower portion of the gate trench; and
    partially removing the work function metal layer together with the gate dielectric layer by an etching process using the residual sacrificial pattern as an etch stop layer, thereby forming the work function metal pattern and the gate dielectric pattern of which upper surfaces are coplanar with an upper surface of the residual sacrificial pattern.

14. The method as claimed in claim 11, wherein forming the gate dielectric pattern and the work function metal pattern includes:
    removing the work function metal layer together with the sacrificial layer by a planarization process, thereby forming the work function metal pattern simultaneously with the sacrificial pattern;
    partially removing the sacrificial pattern from the substrate, thereby forming a residual sacrificial pattern at a lower portion of the gate trench; and
    partially removing the gate dielectric layer together with the work function metal pattern by an etching process using the residual sacrificial pattern as an etch stop layer, thereby forming the gate dielectric pattern of which an upper surface is coplanar with upper surfaces of the residual sacrificial pattern and the work function metal pattern.

15. The method as claimed in claim 11, wherein forming the gate dielectric pattern and the work function metal pattern includes:
    removing the work function metal layer and the gate dielectric layer together with the sacrificial layer by a planarization process, thereby forming the gate dielectric pattern and the work function metal pattern simultaneously with the sacrificial pattern;

partially removing the sacrificial pattern from the substrate, thereby forming a residual sacrificial pattern at a lower portion of the gate trench; and partially removing the work function metal pattern by an etching process using the residual sacrificial pattern as an etch stop layer such that an upper surface of the work function metal pattern is coplanar with an upper surface of the residual sacrificial pattern while sidewalls of the gate trench is covered with the gate dielectric pattern.

16. A method of manufacturing a semiconductor device, the method comprising:

forming an insulation pattern on a substrate, the insulation pattern having first and second gate trenches therein, the first and second gate trenches exposing an active region of the substrate at the bottom of the trenches, the first trenches being in a first region, the second trenches being in a second region, the first region having a lower gate trench pattern density than the second region;

sequentially forming a gate dielectric layer and a work function metal layer on respective sidewalls and bottoms of the first and second gate trenches;

forming a sacrificial layer using a sacrificial material that completely fills the first and second gate trenches in the first and second regions, the sacrificial layer extending along the top surface of the insulation pattern between the adjacent trenches;

planarizing the sacrificial layer without exposing the insulation pattern;

partially removing the sacrificial material to expose portions of the work function metal layer and to form a residual sacrificial pattern in the gate trenches; and etching portions of the work function metal layer and the gate dielectric layer to form respective gate dielectric patterns and work function metal patterns in the first and second trenches, the residual sacrificial pattern serving as an etch stop in the etching of the gate dielectric pattern and the work function metal pattern.

17. The method as claimed in claim 16, wherein the height of the residual sacrificial pattern in the first and second trenches corresponds to etched heights of the gate dielectric layer and the work function metal pattern in the first and second trenches.

18. The method as claimed in claim 16, wherein, in the forming of the work function metal layer, the work function metal layer is formed to extend along a top surface of the insulation pattern between adjacent trenches and, in the forming of the sacrificial layer, the sacrificial layer covers the work function metal layer.

19. The method as claimed in claim 18, wherein the work function metal layer servers as a stop layer when planarizing the sacrificial layer.

20. The method as claimed in claim 16, wherein, in the partial removal of the sacrificial material, an upper portion of the sacrificial material in the first and second trenches is removed such that a top most extent of the sacrificial material in the first and second trenches is lower than adjacent portions of the work function metal layer.

* * * * *